United States Patent [19]

Ishii et al.

[11] Patent Number: 5,493,236
[45] Date of Patent: Feb. 20, 1996

[54] TEST ANALYSIS APPARATUS AND ANALYSIS METHOD FOR SEMICONDUCTOR WAFER USING OBIC ANALYSIS

[75] Inventors: Tatsuya Ishii; Kazutoshi Miyamoto, both of Itami, Japan

[73] Assignee: Mitsubishi Denki Kabushiki Kaisha, Tokyo, Japan

[21] Appl. No.: 264,718

[22] Filed: Jun. 23, 1994

[30] Foreign Application Priority Data

Jun. 23, 1993 [JP] Japan .................................. 5-151968

[51] Int. Cl.$^6$ .................................................. G01R 31/00
[52] U.S. Cl. .......................... 324/752; 324/765; 324/501; 324/750
[58] Field of Search ............................. 324/501, 750, 324/752, 754, 758, 765; 437/7; 219/121.83

[56] References Cited

U.S. PATENT DOCUMENTS

| | | | |
|---|---|---|---|
| 4,761,607 | 8/1988 | Shiragasawa et al. | 342/752 |
| 4,864,227 | 9/1989 | Sato | 324/758 |
| 5,334,540 | 8/1994 | Ishii | 437/7 |
| 5,365,034 | 11/1994 | Kawamura et al. | 219/121.83 |
| 5,394,098 | 2/1995 | Meyrueix et al. | 324/750 |

OTHER PUBLICATIONS

Henley, "Logic Failure Analysis Of CMOS VLSI Using A Laser Probe", IEEE/IRPS, 1984, pp. 69–75.

Tsutsu et al, "Life Time Evaluation Of MOSFET In ULSIs Using Photon Emission Method", Proceedings of IEEE 1992 International Conference on Microelectronic Test Structures, vol. 5, 1992, pp. 94–99.

Inuzuka et al, "Emission Analysis Of Semiconductor Devices From Backside Of The Chip", 3rd European Symposium on Reliability of Electron Devices, Failure Physics and Analysis, 1992.

*Primary Examiner*—Kenneth A. Wieder
*Assistant Examiner*—Kourosh Cyrus Khosravi
*Attorney, Agent, or Firm*—Leydig, Voit & Mayer

[57] ABSTRACT

A test analysis apparatus for OBIC analysis and luminous analysis from a rear surface of a semiconductor wafer. According to the present invention, a semiconductor wafer is mounted on a wafer chuck and a probe card which has metallic needles and which is movable along the X, Y, and Z axes supplies a test pulse signal to respective electrode pads on the front surface of the semiconductor wafer. Then, current generated in the semiconductor wafer is detected at the electrode pads. Optical analysis, such as irradiation with a light beam, detection of reflected light, detection of light generated in the semiconductor wafer and the like, is performed from the rear side of the semiconductor wafer, thereby enabling analysis of a failure or a defect of a defective portion while the semiconductor wafer is in actual operating conditions.

7 Claims, 10 Drawing Sheets

TEST ANALYSIS APPARATUS AND ANALYSIS METHOD FOR SEMICONDUCTOR WAFER USING OBIC ANALYSIS

BACKGROUND OF THE INVENTION

1. Field of the Invention

The present invention relates to a technique for analyzing a failure, defect or the like of a semiconductor device and, more particularly, to a technique for performing OBIC observation and luminous analysis for the semiconductor device.

2. Description of Related Art

It is indispensable to perform analysis of defects of a product which has been determined to be defective through various tests during a manufacturing process or after manufacturing of semiconductor device is completed, in order to improve fabrication yield and the quality of the semiconductor device. The general method for this failure analysis is as follows.

First, a point which induces a failure is found on a semiconductor chip by electrical analysis. Then, a wiring metal, an interlayer isolation iilm or the like is removed by etching or a sectional hole is formed by a focused ion beam, to observe the point causing the failure with an electron microscope or the like. The cause of a failure or a defect is found by these operations. As iora recent semiconductor device which is complicated and of high density, it is particularly important to find a portion causing a iailure or a deiect by the electrical analysis which is the first step.

As the first method of the aforementioned electrical analysis, a light beam irradiates a semiconductor chip to detect an OBIC current generated thereby. This OBIC analysis includes detection oi a defect of a p-n junction or thin silicon oxide film, detection of a latch up, and measurement of a voltage waveform.

As the second method of the electrical analysis, luminous analysis is available for detecting a defect of a p-n junction or a defect of thin silicon oxide film. According to this method, for example, a voltage is applied to a semiconductor chip experimentally in order to detect any weak light generated from the semiconductor chip.

First, the OBIC analysis will be described below. FIG. 7 is an example of conventional OBIC analysis for detecting a latch up, the example being explained in Daniel J. Burns et al: IEEE 21st annual proc. tel. phys., p118 (1983). Reference numeral 1 designates an optical microscope, in which an object lens 1a faces downward. A semiconductor chip 2 is mounted therebelow. A laser beam is transmitted from a laser beam source 3 and moved so as to scan the semiconductor chip along the X-axis and Y-axis by means of an X-Y mirror 4. Then, the laser beam irradiates the semiconductor chip 2 through the optical microscope. A voltage is applied to the semiconductor chip 2 by means of a bias power supply 5. The OBIC current which is generated by the irradiation with the light beam in the semiconductor chip 2 is amplified by means of an OBIC current amplifier 6a and converted to brightness. The brightness displayed on a display unit 8 by an interface circuit 7 in synchronism with the scanning by the X-Y mirror. Numeral 6b designates a zero point adjusting device. The OBIC current amplifier 6a, the zero point adjusting device 6b, the interface circuit 7 and the display 8 are controlled by means of a computer 9. As a result, it is possible to observe the distribution of an OBIC current on the surface of the semiconductor chip 2, that is, an OBIC image, so that the latch up or the like can be detected.

FIG. 8 is an example of conventional OBIC analysis system for measuring the waveform indicated in F. J.Henley: IEEE 22nd annual proc. ref. phys., p69(1984). The object lens 1a of the optical microscope 1 faces downward as in FIG. 7 and a semiconductor chip 2 is mounted therebelow. A laser irradiates the semiconductor chip 2 by means of the optical microscope 1. The OBIC current generated in the semiconductor chip 2 in response to irradiation by the laser beam is amplified by means of the OBIC current amplifier 6 and then converted to voltage waveform by means of a logic state analyzer 11. The converted product is displayed on the display 8 through the microcomputer 9. In FIG. 8, the representation of the laser beam source is omitted. Reference numeral 1b designates a beam lamp, numeral 1c designates a laser/beam scriptor, numeral 12 designates a TV camera, numeral 9a designates a keyboard, numeral 9b designates a floppy disk, and numeral 76 designates an X-Y stage.

In the system shown in FIG. 8, observation oi the semiconductor chip 2 for aligning the laser irradiating position is performed by means of the beam lamp 1b and detecting the reflected light by means of the TV camera. However, it is possible to represent an image of the surface of the semiconductor chip 2 on the display unit 8 by scanning with a laser beam projected by the X-Y mirror 4 (see FIG. 7) and then actuating the interface circuit 7 (see FIG. 7) which synchronizes light reflected by laser irradiation the scanning with laser beam as in the observation of the OBIC image shown in FIG. 7. Then, the laser irradiating position of the surface of the semiconductor chip for measuring the voltage waveform is fixed by moving the X-Y stage 16 along the X and Y-axes while laser beam is fixed to a single point. Observation of the OBIC image is performed by fixing the laser beam to a single point and scanning the X-Y stage 16 instead of scanning with the laser beam projected by the X-Y mirror and displaying the OBIC current generated in the interface circuit in synchronism with the scanning the X-Y stage FIG. 9 shows an example of conventional luminous analysis system indicated in N.Tsutsu er al: IEEE 1992 Int. Conf. on Microelectronic Test Structure, Vol. 5, March, p94 (1992). The object lens 1a of the optical microscope 1 faces downward as in FIGS. 7 and 8 and the semiconductor chip 2 is placed therebelow. The semiconductor chip 2 is biased with voltage or pulse signal by means oi a bias power supply or a pulse generating device although the representation thereof is omitted in this Figure. When this voltage Or pulse signal is applied to the semiconductoro chip, weak light is generated from the semiconductor chip 2. This light is detected by means of a photon counting camera 14 through a waveform filter 13 and displayed on the display 8 by means of an image processing device 15. Consequently, it is possible to detect a defect of a p-n junction or thin silicon oxide iilm. Numeral 8a designates a controller of the display 8.

In the aforementioned OBIC analysis apparatus and luminous analysis apparatus, the front side of the semiconductor chip in which an electrode pad or metallic wiring is disposed is irradiated with a laser beam from the front thereof and projected light is detected. However, in recent semiconductor devices, the metallic wiring on the iront side of the semiconductor chip has been configured in a multi-layer or an LOC package in which an internal lead disposed on the surface of the semiconductor chip has been utilized, so that substance intercepting light beam has been often utilized on the front side of the semiconductor chip. Thus, the OBIC analysis and luminous analysis have become difficult to do. As a result, a method in which infrared laser light is irradiated from the rear side of the semiconductor to perform OBIC analysis as shown in T. Ishii et al: IEICE Technical Report, R91–34, p29(1991), and a method in which infrared light is detected from the rear side of the semiconductor to perform luminous analysis as indicated in E. Inuzuka et al: 3rd Eur. Symposium on Rel. of Electron devices, Failure phys. and analysis, Proc., p269(1992) and the like have been considered.

Although the aforementioned apparatus are conventionally available for analyzing a failure or a defect of a semiconductor device, a bias voltage, or a pulse signal is only applied to a specific position of the semiconductor chip at the time oi analysis and the analysis is not executed with the semiconductor chip being practically actuated. Thus, the conventional apparatus are not capable of detecting an active failure or defect of the semiconductor chip. In the conventional OBIC analysis or luminous analysis executed from the rear side of the semiconductor chip, because a semiconductor device is formed by sealing a semiconductor chip in a package, the analysis is performed after part of the rear portion of the package is removed to expose the semiconductor chid or equivalent processing is performed. There were no apparatuses which were capable of such an analysis from the rear side of the semiconductor wafer. Particularly, unless a product determined to be defective by functional test after wafer processing ends is subjected to defect analysis in one wafer state, it is not possible to expect a rapid improvement of fabrication yield and quality.

SUMMARY OF THE INVENTION

In view of the aforementioned problems of the prior art, an object of the present invention is to provide an apparatus for OBIC analysis and luminous analysis and further an analysis method in which the OBIC analysis and luminous analysis can be performed from the rear side of each respective chip in a semiconductor device wafer while the respective chip is actuated.

According to a first aspect of the present invention, there is provided a semiconductor wafer test analysis apparatus for a semiconductor wafer in which a plurality of circuits, metallic wiring and electrode pads are formed, comprising a first light irradiating/detecting means for irradiating a rear side of a semiconductor wafer, detecting light reflected from the rear side and further irradiating the rear surface with a laser beam in order to perform OBIC analysis and a test pulse signal supplying/current detecting means for supplying a test pulse signal, for performing test analysis with the semiconductor wafer actuated to respective electrode pads on the front surface of the semiconductor wafer, and for detecting a current generated in the semiconductor wafer while irradiating with the beam, from the electrode pad, the semiconductor wafer test analysis apparatus irradiating the rear side with the semiconductor wafer being actuated and then detecting a current generated in the semiconductor wafer in order to inspect and analyze a defective portion.

According to a second aspect of the present invention, there is provided a semiconductor wafer test analysis apparatus ior a semiconductor wafer in which a plurality of circuits, metallic wiring and electrode pads are formed on the front surface thereof, the semiconductor wafer test analysis apparatus comprising a pulse signal supplying means for supplying a test pulse signal for perlorming test analysis with a semiconductor wafer actuated and a pulse signal for luminous analysis, to each respective electrode pad on the front surface of the semiconductor wafer which is subjected to the analysis and a second light irradiating/detecting means irradiating the rear surface of the semiconductor wafer and detecting light deflected from the rear surface and in which light generated in the semiconductor wafer by the applied pulse signal is detected from the rear side of the semiconductor wafer, the semiconductor wafer test analysis apparatus being constructed so that the pulse signal for luminous analysis is supplied while the semiconductor wafer is actuated and light generated in the semiconductor wafer being detected from the rear side in order to inspect and analyze a defective portion.

According to a third aspect of the present invention, there is provided a semiconductor wafer test analysis apparatus which includes the functions of the aforementioned two inventions.

According to the first to third aspects of the present invention, a test pulse signal is supplied to each respective pad provided on the front surface of the semiconductor wafer to operate the semiconductor wafer in actual operating conditions in order to analyze a defective portion. As a result, it becomes possible to inspect a failure of a portion which is not actuated if only a bias voltage is applied, thereby enabling more detailed analysis of a failure and defect. Additionally, because optical inspection is performed from the rear side of the semiconductor wafer on which no electrode pad, metallic wiring or the like is present, no light beam is intercepted by any electrode or metallic wiring, thereby causing no obstacle on the inspection.

According to another aspect of the present invention, in the aforementioned three aspects of the invention, the test head provided on the front side of the semiconductor wafer for generating a test pulse signal or the like and receiving current generated in the semiconductor wafer has a ring-like shape and a positioning optical microscope for positioning the electrode pad of the semiconductor wafer and the metallic needle of the probe card connected thereto is disposed in a through hole in the center of the test head. Consequently, the test head can be disposed near the probe card thereby minimizing the length of the wiring between the test head and the probe card, and eliminating a possibility that the test pulse signal may be attenuated.

According to still another aspect of the present invention, in the aforementioned three aspects of the invention, an image reflected from the rear surface of the semiconductor wafer is placed over an inspected OBIC image or luminous image, thereby making it possible to indicate a defective portion more clearly.

Further, the present invention also includes a test analysis method for the semiconductor wafer.

BRIEF DESCRIPTIONOF THE DRAWINGS

DESCRIPTION OF THE PREFERRED EMBODIMENTS

Embodiment 1

Figure 1:
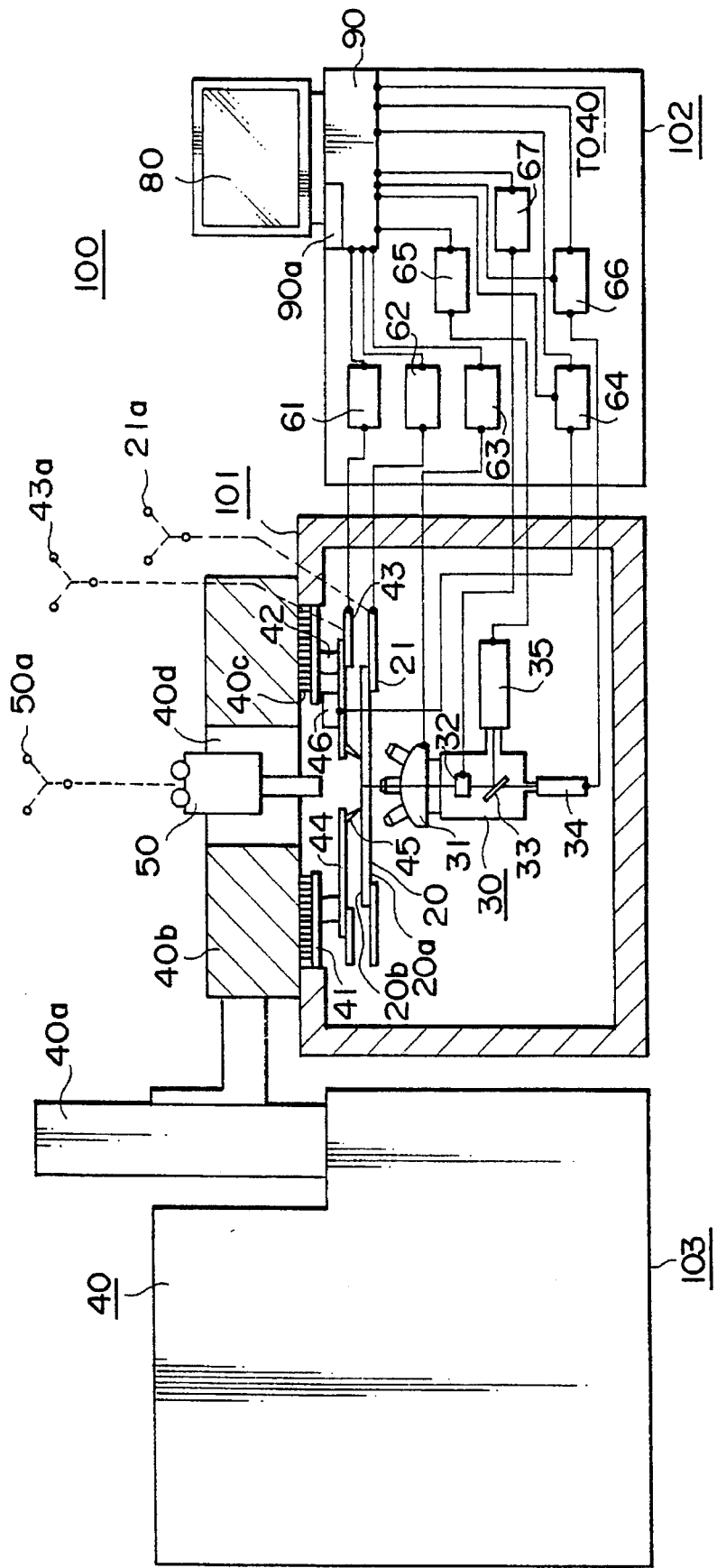
FIG. 1 is a construction drawing of a semiconductor wafer test analysis apparatus for performing OBIC analysis.

FIG. 1 is a drawing showing the construction of a semiconductor wafer test analysis apparatus according to an embodiment of the present invention. This apparatus performs OBIC analysis. A test analysis apparatus 100 comprises a main unit 101, a control unit 102 and a tester unit 103.

Figure 1A:
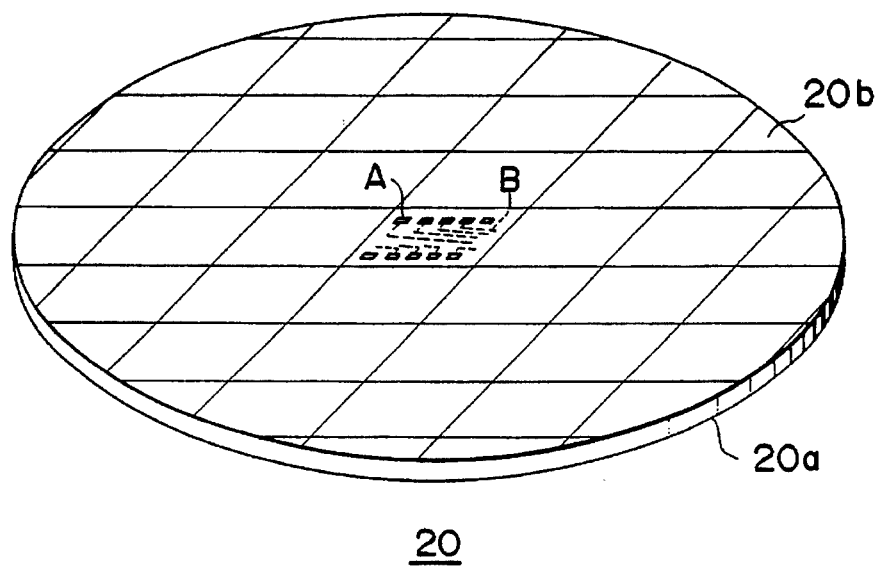
FIG. 1A is a perspective view schematically showing the state of the front side of a semiconductor wafer.

In the main unit 107, numeral 20 designates a semiconductor wafer in which a plurality of semiconductor chips (see FIG. 1A) are located. Numerals 20a, 20b are the rear side and the front side thereof, respectively. The front side 20b includes circuits, metallic wiring B, electrode pad A and the like which are located on the surface. Numeral 21 designates a wafer chuck for fixing the semiconductor wafer 20 and numeral 21a designates an XYZ driving mechanism for wafer chuck. Numeral 41 30 designates an optical microscope, numeral 31 designates an object lens which is movable along X-axis, Y-axis and Z-axis. Numeral 32 designates an X-Y mirror, numeral 33 designates a half mirror, numeral 34 designates a photomultiplier, and numeral 35 designates a laser beam source. Numeral designates an performance board fixed to the case of the main unit, numeral 42 designates a flexible cable, numeral 43 designates an a probe stage, numeral 43a designates XYZ driving mechanism for the probe stage, numeral 44 designates a probe card, numeral 45 designates a metallic needle and numeral 46 designates an OBIC current preamplifier. Numeral 50 designates an an optical microscope for positioning, numeral 50a designates XYZ driving mechanism for the microscope. The XYZ driving mechanism 21a for the wafer chuck and the XYZ driving mechanism 43a for the probe stage are mounted, in the case of the main unit 101, in an actual apparatus.

Figure 1B:
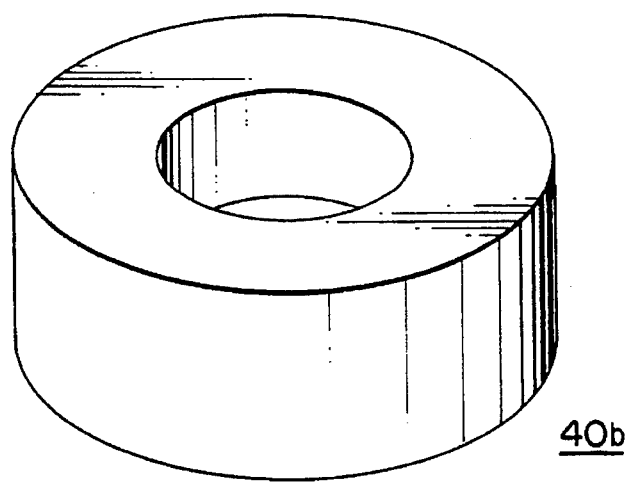
FIG. 1B is a perspective view schematically showing an example of a test head configuration.

Referring to the tester unit 103, numeral 40 designates an LSI tester, numeral 40a designates a support, numeral 40b designates a ring-like test head (see FIG. 1B) which moves vertically along the support 40a, numeral 40c designates a pogo pin and numeral 40d designates a through hole in which a positioning optical microscope 50 is received, disposed in the center of the test head 40b.

In the control unit 102, numeral 61 designates a probe stage controller, numeral 62 designates a wafer chuck controller, numeral 63 designates an object lens controller, numeral 65 designates a laser beam controller, and numeral 67 designates an X-Y mirror controller. These components are installed to control the devices installed on the main unit 101. Numeral 64 designates an OBIC current amplifier and numeral 66 designates an optical amplifier. The OBIC current amplifier amplifies a signal dispatched from the OBIC current preamplifier 46 and a signal dispatched from the photomultiplier 34. Numeral 90 designates a computer for controlling the entire test analysis apparatus 100 and numeral 90a designates a memory unit for storing various programs for performing a desired test. The computer 90 executes test analysis according to a program stored in the memory unit 90. Numeral 80 designates a display for displaying the result of the analysis.

Figure 7:
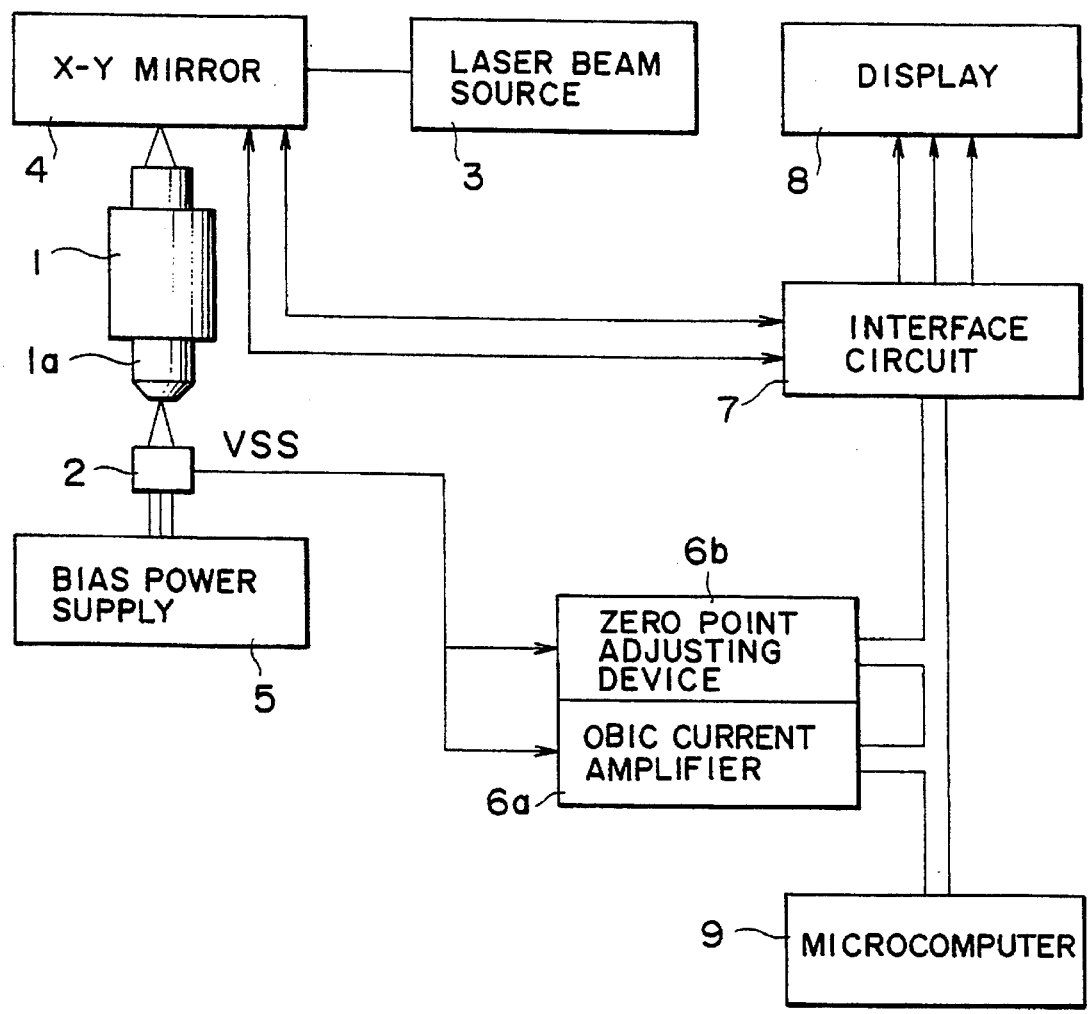
FIG. 7 is a construction drawing of a semiconductor chip test analysis apparatus for conventional OBIC analysis.
Figure 8:
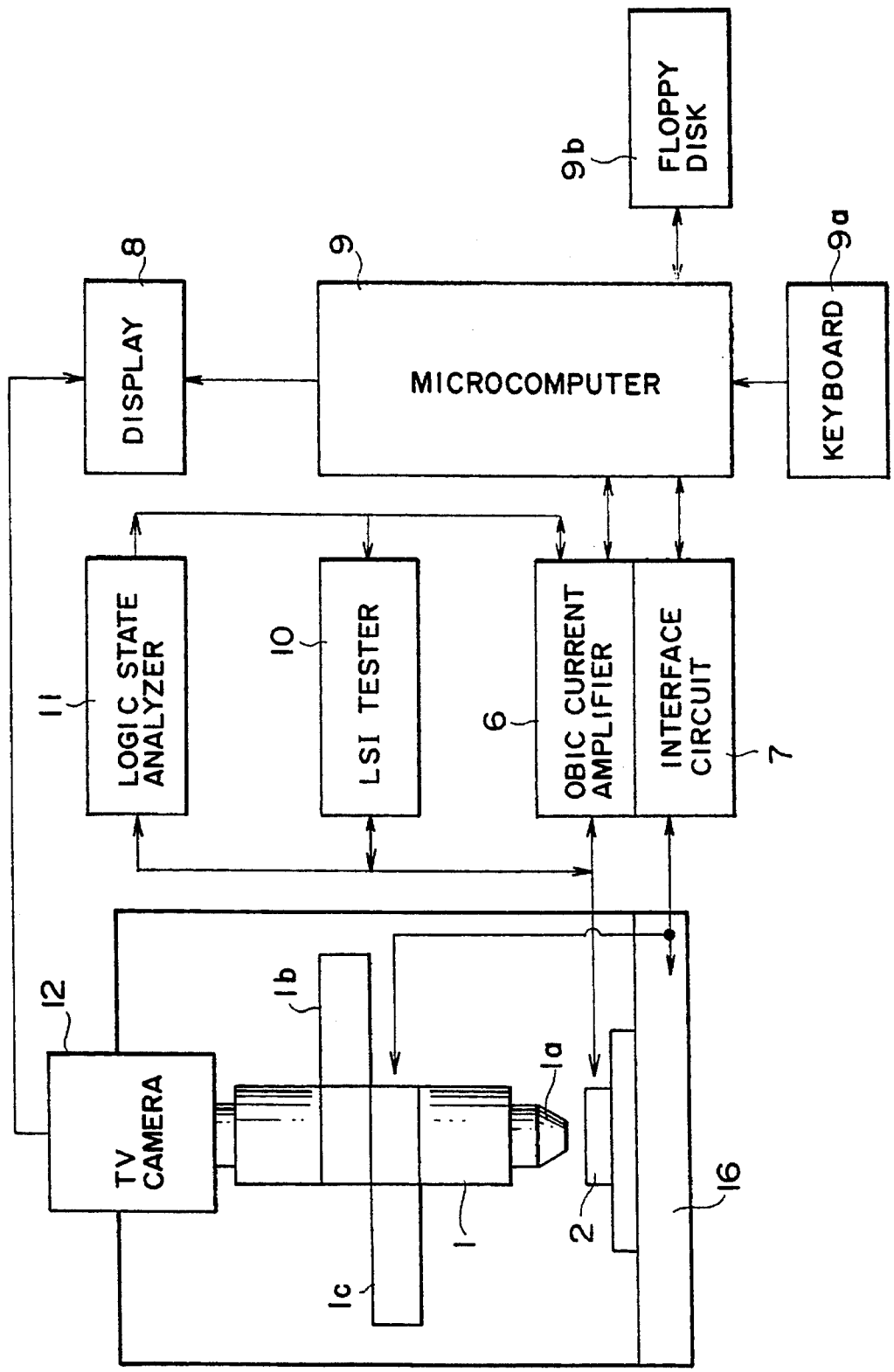
FIG. 8 is a construction drawing of still another test analysis apparatus for conventional OBIC analysis.
Figure 9:
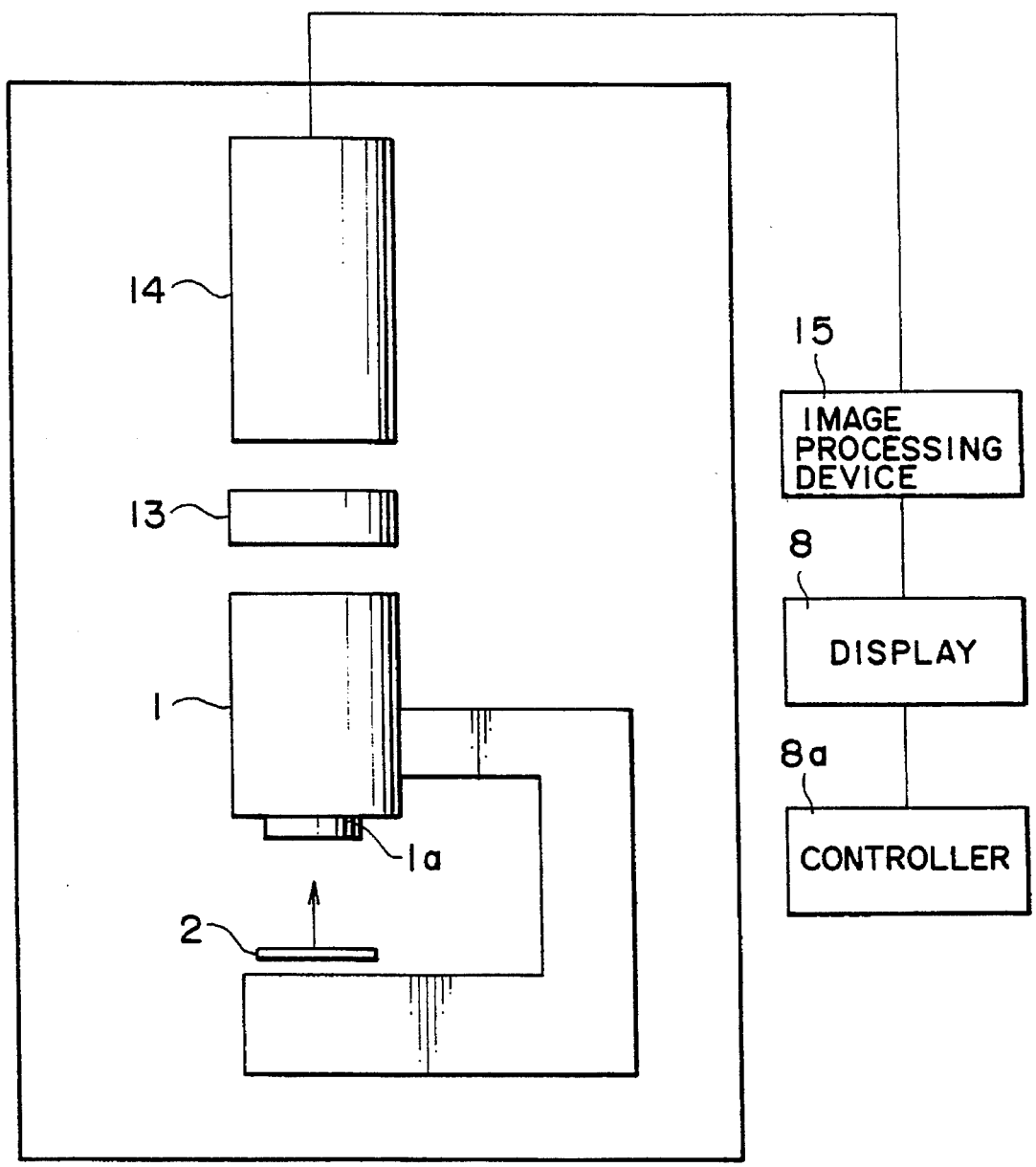
FIG. 9 is a construction drawing of conventional semiconductor chip test analysis apparatus for luminous analysis.

The optical microscope 30 is inverted with respect to the conventional apparatus shown in FIGS. 7–9. A semiconductor wafer 20 is disposed above the optical microscope 30. A laser beam transmitted from the laser beam source 31 irradiates the rear surface 20a of the semiconductor wafer 20 through a half mirror 33, an X-Y mirror 32 and an object lens 31. Light reflected from the rear surface of the semiconductor wafer 20 is detected by the photomultiplier 34. The detected light is amplified by means of an optical amplifier and the information is transmitted to the computer 90. The computer 90 controls the X-Y mirror 32 through the X-Y mirror controller 67 in order to scan along the X-axis and the Y-axis with the laser beam and the intensity of light obtained from the optical amplifier in synchronism with the optical amplifier is displayed on the display 80 in order to form a reflected image from the rear surface 20a of the semiconductor wafer 20. The reflected image indicates, the entire image of an analysis area on the rear surface 20a of the semiconductor wafer 20. By placing an OBIC image of the analysis result described later over this image, it is possible to confirm which part is defective.

Next, the semiconductor wafer 20 is fixed on a wafer chuck 21. The wafer chuck 21 can be moved by means of XYZ driving mechanism 21a, however, the wafer chuck is fixed to a predetermined position except in special cases. A probe card 44 fixed to a probe stage 43 which is moved along the X-axis, Y-axis and Z-axis by means of the driving mechanism 43a is disposed above the semiconductor wafer 20. A plurality of metallic needles 45 which correspond to respective electrode pads (not shown) on the front side 20b of a single chip of the semiconductor wafer 20 are fitted to the probe card 44. A positioning optical microscope 50 provided with the driving mechanism 50a is disposed above the probe card 44. By moving the probe stage 43 along the X-axis, Y-axis and Z-axis while observing the stage by means of the optical microscope 50, the metallic needle 45 is positioned so as to be in contact with the electric pad. Control of the probe stage 43 with respect to the X-axis, Y-axis and Z-axis is performed by means of the computer 90 through the probe stage controller 61.

The range in which the semiconductor 20 is analyzed in a single time is not restricted to at one semiconductor chip but is determined by the congiguration of a chip on the semiconductor wafer, the construction of the probe card 44 and the like.

As regards test signals to be supplied to the semiconductor wafer for OBIC analysis, the present invention utilizes a test pulse signal which is given to, for example, respective electric pads (not shown) of a single chip of the semiconductor wafer 20 in order to place the chip in the same conditions as actual operating condition, instead of the conventional ordinary bias voltage and a test is performed with the chip in the actual operating condition. Consequently, it is possible to make a judgment relating to defects in the semiconductor chip or the entire semiconductor wafer. However, different from the conventional bias voltage and the like, the length of the wiring is minimized because the pulse of the test pulse signal including, for example, a pulse signal having a high frequency is weakened if the length of the wiring is long.

The test head 40b of the LSI tester 40 contains a power supply necessary for inspecting the electric function of the semiconductor wafer 20, a driver circuit which generates the aforementioned test pulse signal and a comparator circuit (not shown) for detecting electric signals output from the semiconductor wafer at the time of test analysis. The test pulse signal is transmitted from the pogo pin 40c under the test head 40b through the flexible cable 42 to the probe card 44 and then the electric signal is applied to the electric pad on the semiconductor wafer 20 with which the respective metallic needles 45 are in contact through the respective metallic needles. According to the present invention, the test head 40b has a ring shape in which a central through hole for receiving a positioning optical microscope 50 for positioning the electric pad and the metallic needle 45 is provided, so that the test head 40b and the probe card 44 can be disposed on the front surface 20b of the semiconductor wafer 20 with the test head and the probe card are arranged near each other. As a result, it is possible to connect the probe card 44 having the metallic needle 45 with the test head 40b with very short wiring, thereby improving the test pulse signal. The test head 40b is connected with the probe card 44 through a performance board 41 which is in contact with the pogo pin 40c of the test head 40b. The performance board 41 is connected with the probe card 44 through the flexible cable 42 because the performance board 41 is fixed and the probe card 44 is movable along the X-axis, Y-axis and Z-axis.

Next, OBIC current generated by irradiating the rear surface 20a of the semiconductor wafer 20 with laser light is detected by the metallic needle 45 of the probe card 44 and the OBIC current is amplified by means of the OBIC current preamplifier 46 and the OBIC current amplifier 64 and the information is sent to the computer 90. The computer 90 converts OBIC current obtained irom the OBIC current amplifier 64 to brightness in synchronism with laser irradiation by means of the X-Y mirror controller 67 and an obtained brightness is displayed on the display 80 so that the OBIC image from the rear surface 20a of the semiconductor wafer 20 can be observed. Then, an image reelected from the rear surface 20 obtained from signals from the aforementioned photomultiplier 34 is placed over the OBIC image and the result is displayed on the display 80, thereby making it possible to recognize a failure, a defect or the like of the semiconductor wafer 20.

Changes with the passage of time in information about the OBIC current obtained from the analysis is graphed so as to correspond to changes of test pulse signals with the passage of time and then displayed on the display 80 in order to measure voltage waveform. The method oi processing of results obtained from the analysis can be changed arbitrarily by storing a desired program in the memory unit 90a of the computer 90.

Figure 2:
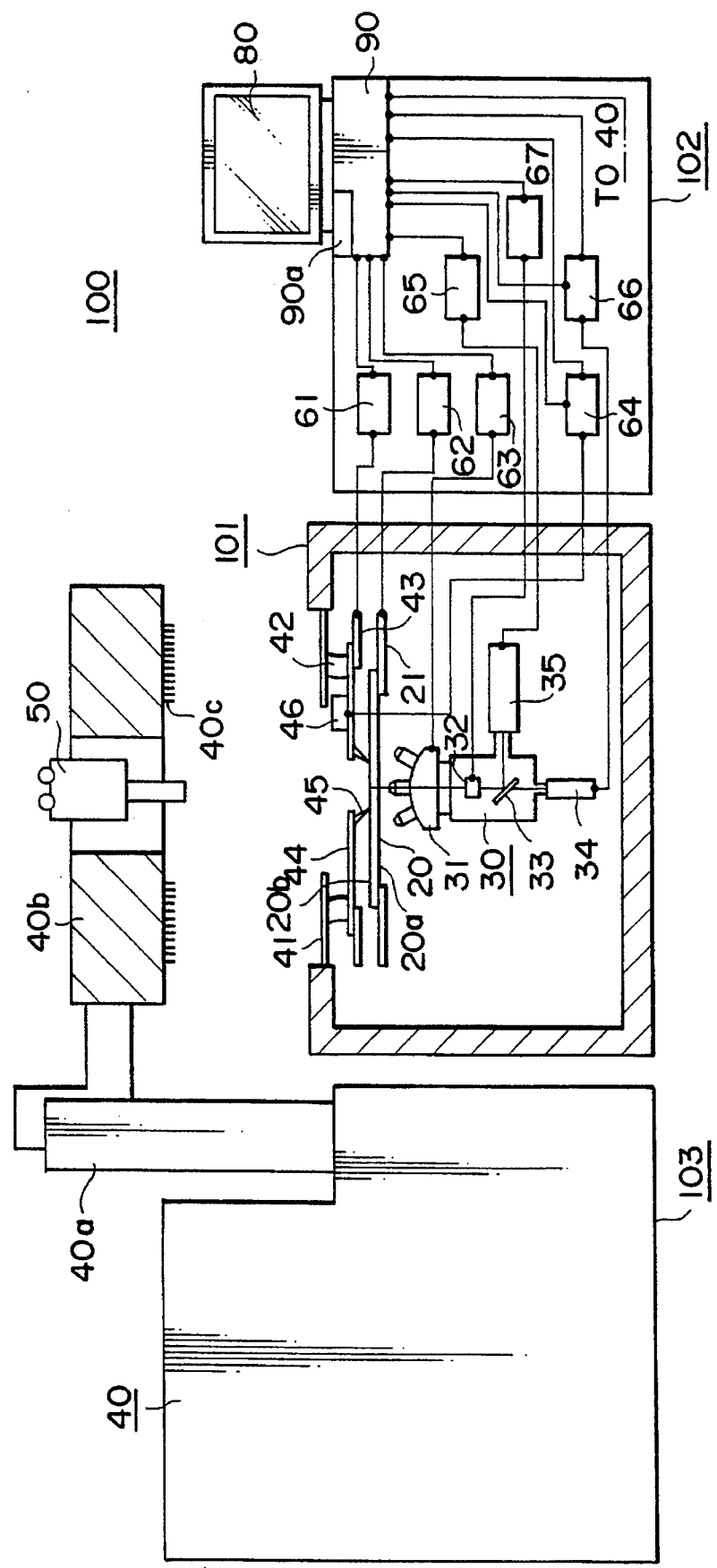
FIG. 2 is a drawing showing the test analysis apparatus shown in FIG. 1 when the tester head is removed.

FIG. 2 shows the test analysis apparatus shown in FIG. 1 when the test head thereof is removed. The representation of each XYZ driving mechanism is omitted. The test head 40b of the LSI tester 40 is separated from the performance board 41 and is located on the upper position of the support 40a. In this condition, a sample (semiconductor wafer) is replaced.

A method for narrowing down a particular defective area in test analysis will be described below. First, using an ordinarily used test program for mass production, a defective chip is tested. From this test result, the defective area of the chip is narrowed down. In the case of a micro computer, for example, the test program is divided into a program for testing the "arithmetic operator", a program ior testing the "memory", a program for testing the "timer" and the like. Depending on which program recognizes a defect, it is possible to determine which function of the "arithmetic operator", "memory" and "timer" has a defect in its circuit area. Next, a further detailed test is performed using a program for testing only a preliminarily prepared or individually produced circuit area which is estimated to have a defect. These various programs are stored in the memory unit 90a of the computer 90 together with a program which actuates the entire test analysis apparatus 100.

The test pulse signal to be applied to a chip at the time of testing is produced according to the test program. By changing the test program for mass production to a test program for testing only a defective area, the ratio of the time in which voltage is applied to the defective area increases as compared with the total test time. Thus, it is possible to increase the S/N ratio for detecting OBIC current or a flash in a luminous analysis described later, thereby enabling a more detailed, accurate analysis.

As described above, in the test analysis apparatus according to the present invention, the semiconductor device is analyzed from the rear surface where no metallic wiring is present, with the semiconductor device being in the semiconductor wafer state and the semiconductor chip being actuated. Thus, it becomes possible to perform a test analysis of the portion which is not operated if a test voltage is applied, unlike conventional test, and the analysis is executed in a state corresponding to actual operation of the semiconductor chip. Thus, it is possible to determine a failure of the semiconductor wafer in more detail.

Because the test head 40b and the probe card 44 are disposed on the front side 20b of the semiconductor wafer 20 so that they are near each other, the probe card 44 and the test head 40b can be connected with each other with very short wiring in order to improve the test pulse signal, thereby performing a more accurate analysis.

Further, the probe card 44 and the test head 40b are disposed at the front side 20b of the semiconductor wafer 20 and an optical microscope 30 for failure analysis is disposed at the rear surface 20a. Consequently, an open space can be obtained on the rear surface 20a of the semiconductor wafer 20. Thus, it is possible to increase the freedom of the disposition of the optical microscope for analysis which requires a high accuracy.

The defect of a product which is determined to be defective by a functional test after wafer processing is finished during manufacturing of the semiconductor device can be analyzed in the wafer state thereby improving fabrication yield and quality quickly. In particular, as for the semiconductor device, it is possible to reduce the period of wafer process development.

The aforementioned advantages are also achieved in the embodiments described below.

Embodiment 2

Figure 3:
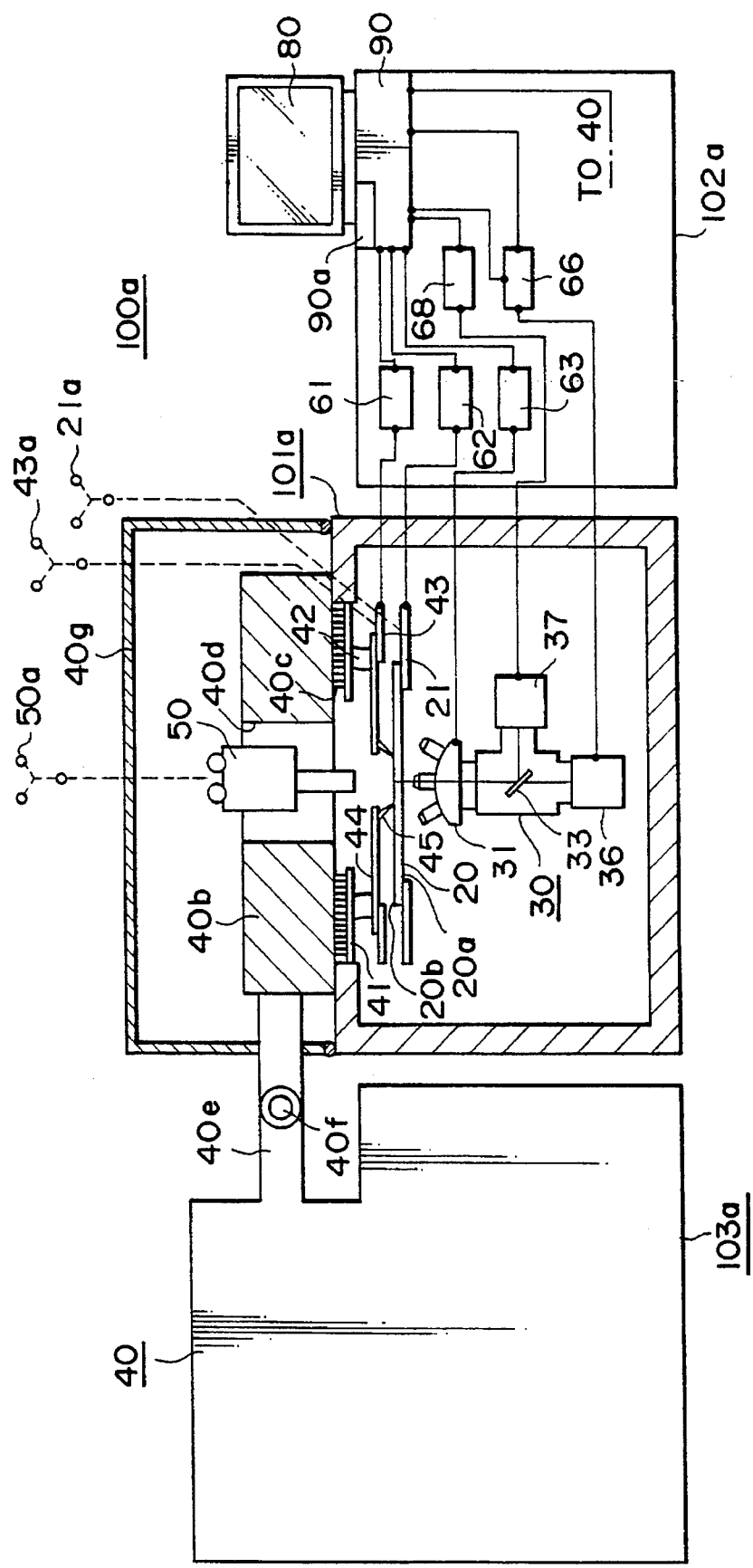
FIG. 3 is a construction drawing of a semiconductor wafer test analysis apparatus for achieving luminous analysis according to the present invention.

FIG. 3 shows the construction of a semiconductor wafer test analysis apparatus according to another embodiment of the present invention. This apparatus performs luminous analysis. A test analysis apparatus 100a according to the present embodiment comprises a main unit 101a, a control unit 102a and a tester device 103a. The same reference numerals are attached to the same or equivalent parts of the apparatus shown in FIGS. 1 and 2 and the description thereof is omitted.

In the optical microscope according to the present embodiment, light transmitted irom the infrared ray lamp 37 irradiates the rear surface 20a of the semiconductor wafer 20 through the hale mirror 33 and the object lens 31. Light reflected from the rear surface 20a of the semiconductor wafer 20 is detected by a photon counting camera 36. The detected light is amplified by an optical ampifiier 66 and the information is sent to the computer 90. The computer 90 displays the intensity of light obtained by the optical amplifier 66 on the display 80 in order to observe a reflected image from the rear surface 20a of the semiconductor wafer 20. The reflected image is an image of the entire area of, for example, the semiconductor wafer 20 to be subjected to luminous analysis and then it is possible to recognize which areas are defective by placing this reflected image over a luminous image which is the result of the analysis described later.

The semiconductor wafer is fixed by means oi a wafer chuck 27 as in the embodiment shown in FIG. 1. Positioning between the respective metallic needle 45 of the probe card 44 and, for example, the electrode pad (see FIG. 1A) corresponding to a single semiconductor chip, disposed on the front side 20b of the semiconductor wafer 20, is performed by the positioning optical microscope 50.

When luminous analysis is performed, a test pulse signal for securing actual operating conditions is applied to, for example, each electrode pad (not shown) of a single chip of the semiconductor wafer 20 as in the embodiment 1 in order to actuate that chip. A applied voltage necessary for luminous analysis is supplied from the metallic needle 45 of the probe card 44. Thus, it is possible to detect failures or defects oi the semiconductor chip or entire semiconductor wafer. As in embodiment 1, according to the present embodiment, it is possible to connect the probe card 44 with the test head 40b with very short wiring to improve the quality of the test pulse signal and secure an open space on the rear surface 20a of the semiconductor wafer 20 in order to increase the freedom of the disposition of the analysis optical microscope 30.

A test signal for luminous analysis is supplied from the respective metallic needles 45 of the probe card 44 to the semiconductor wafer 20 (semiconductor chip) and consequently, weak light is generated from the rear surface 20a. The weak light is detected by a photon counting camera 36 and amplified by means of an optical amplifier 66. Then, the information is transmitted to the computer 90. The computer 90 converts a signal obtained from the optical amplifier 66 to brightness and the converted value is displayed on the display 80 as a luminous image of the rear surface of the semiconductor wafer 20, The luminous image is placed over the image reflected from the rear surface 20 of the aforementioned semiconductor waier and the overlapping image is displayed on the display 80. Thus, it is possible to recognize a failure or deiect of the semiconductor waier 20. The method for narrowing down a defective portion is the same as explained in embodiment 1.

The infrared ray lamp 37 is controlled by the computer 90 through a beam lamp controller 68 and the test head 40b is covered with a shading cover 40g to prevent external light from entering when luminous analysis is performed.

Figure 4:
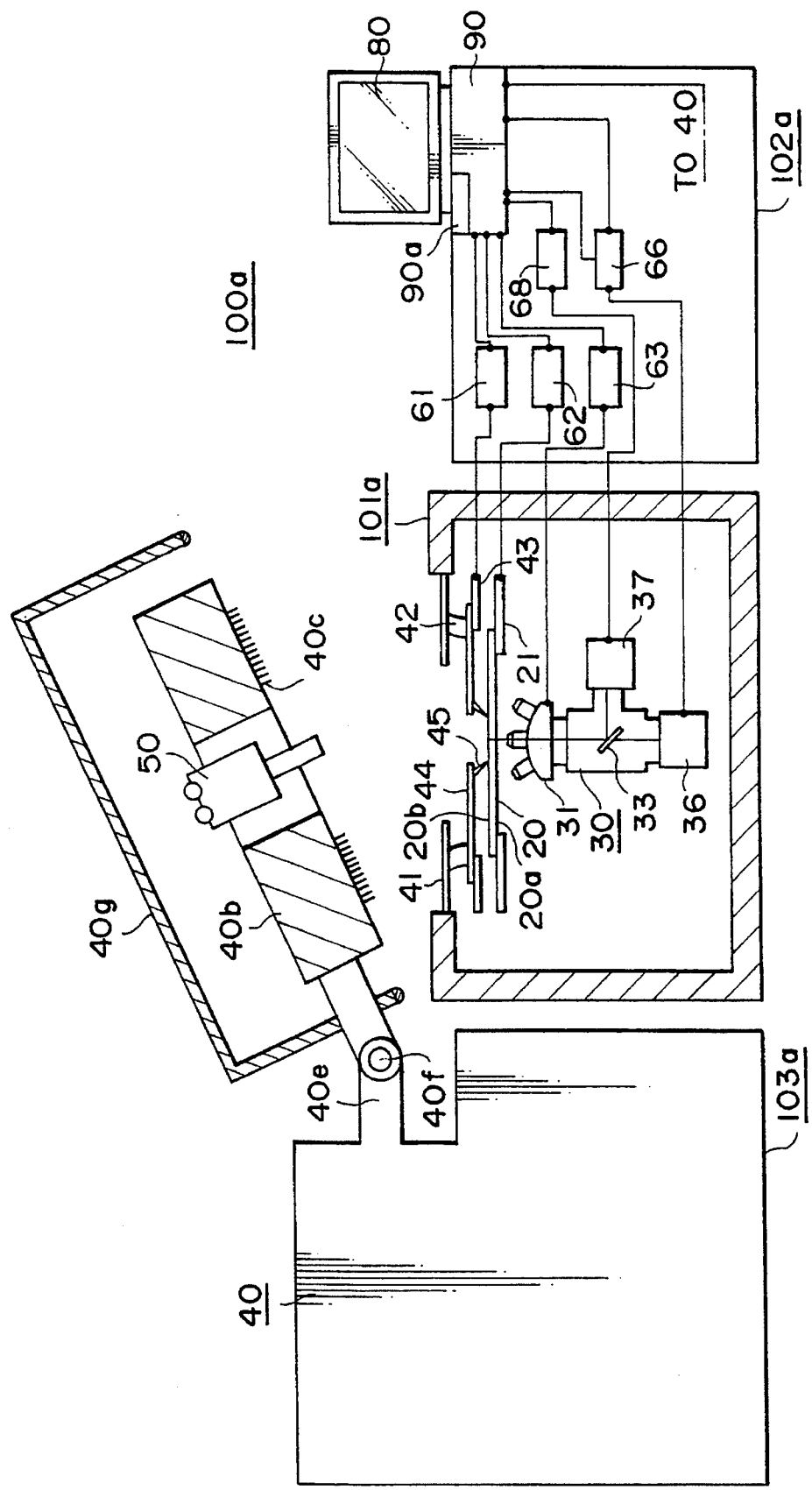
FIG. 4 is a drawing of the test analysis apparatus shown in FIG. 3 when the tester head is removed.

FIG. 4 shows the condition in which the test head of the test analysis apparatus shown in FIG. 3 is removed. The same Figure shows the case in which the test head 40b of the LSI tester 40 is fixed by an arm 40e, and the test head 40b is swingable with respect to an arm rotating portion 40f. FIG. 4 shows the condition at the time of semiconductor wafer replacement in which the test head 40b is separated from the performance board 41.

Figure 5:
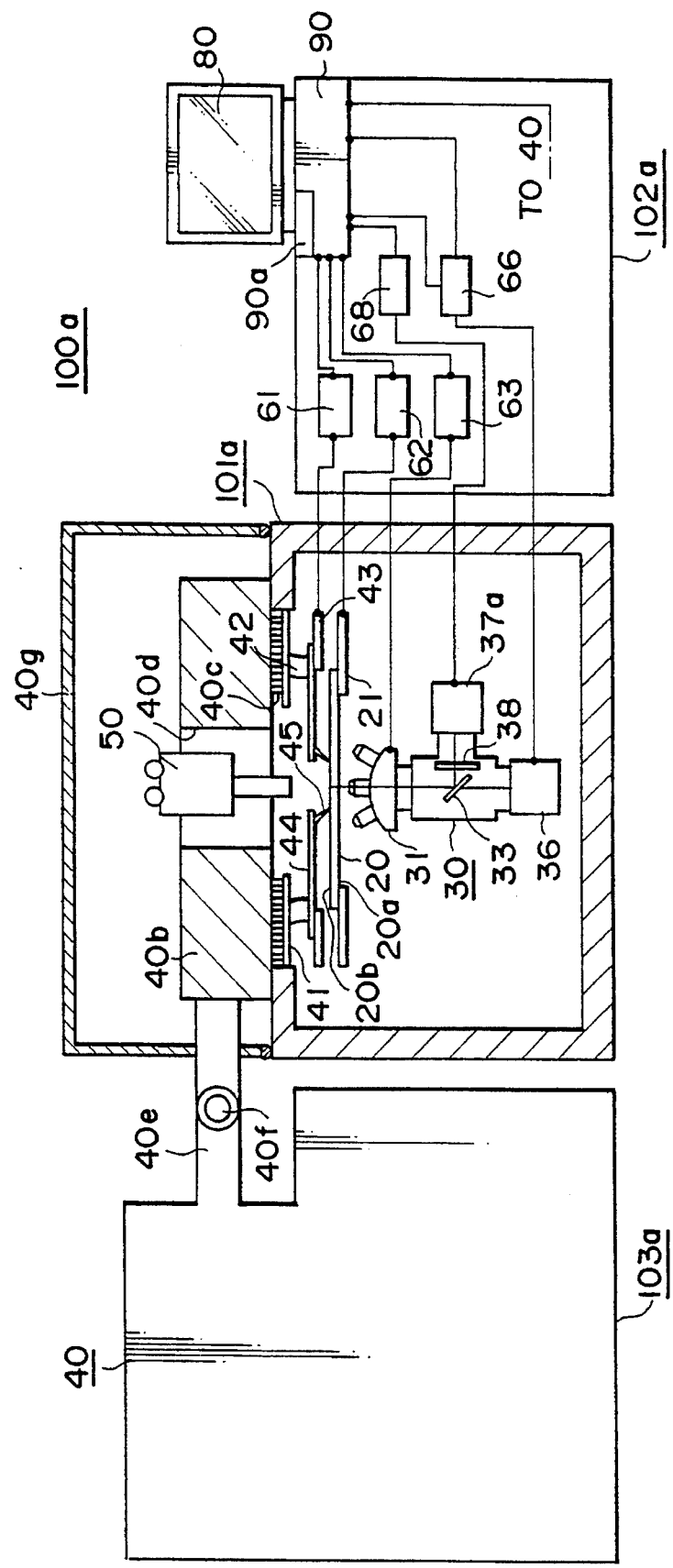
FIG. 5 is a drawing showing another embodiment of the test analysis apparatus shown in FIG. 3.

FIG. 5 shows the case in which a beam lamp 37a is used instead of the infrared ray lamp 37 in the test analysis apparatus for periorming luminous analysis as shown in FIGS. 3 and 4 in order to irradiate the semiconductor wafer 20 with infrared rays through a filter 38. The other portions are the same as in FIGS. 3 and 4.

Embodiment 3

Figure 6:
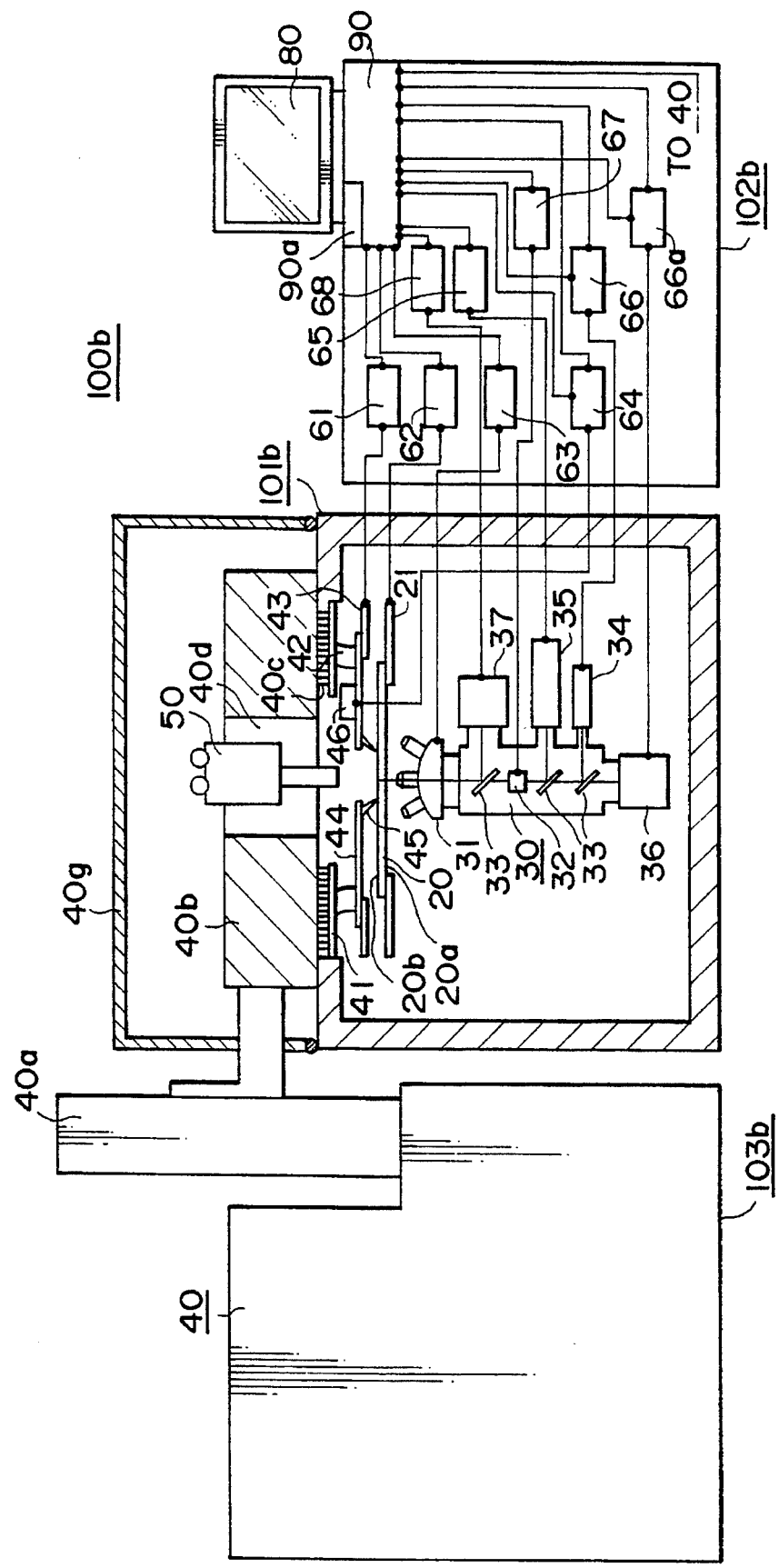
FIG. 6 is a construction drawing of a semiconductor wafer test analysis apparatus in which OBIC analysis and luminous analysis according to the present invention can be performed.

FIG. 6 shows a test analysis apparatus having both the iunctions of the OBIC analysis system shown in FIG. 1 and the luminous analysis system shown in FIG. 3. The inirared ray lamp 37, the laser beam source 35, the photomultiplier 34, and the photon counting camera 36 are included, in a single optical microscope 30 and light is directed to the aforementioned device by three half mirrors 33. The other basic construction is the same as in FIGS. 2 and 3. A desired analysis is carried out according to a program stored in the memory unit 90a of the computer 90 in the aforementioned steps.

Although the apparatus for the OBIC analysis and luminous analysis have been described in the aforementioned respective embodiments, the present invention is not restricted to these examples. The present invention is applicable to all analyses in which electrical measurement and optical measurement of a semiconductor wafer are performed and the same effects can be obtained.

As described above, according to the present invention, a test pulse signal is supplied to each electrode pad on the front side of the semiconductor wafer to actuate the semiconductor wafer for analyzing a defective portion. Further, optical inspection by, for example, irradiating the semiconductor wafer with light is performed from the rear side of the wafer. As a result, it is possible to inspect a defect in a portion of the semiconductor wafer which is not activated if only a bias voltage is applied, so that a further detailed analysis of defects can be performed. Because optical inspection is performed from the rear side of the semiconductor wafer where no metallic wiring or electrode pad is present, the light beam is not blocked by the metallic wiring or electrode pad, so that a further reliable analysis can be performed. Because the electrical inspection portion is disposed at the front side of the semiconductor waier and the optical inspection portion is disposed at the rear surface thereof, it is possible to secure an open space on the rear surface of the semiconductor wafer thereby increasing the freedom of disposition of the analysis optical microscope which comprises optical irradiating/detecting means and which requires a high accuracy.

Because the test head provided on the front side of the semiconductor wafer is formed in a ring-like shape and an optical microscope for positioning the electrode pad of the semiconductor waier and ior positioning the metallic needle of the probe card is disposed in a through hole in the center of the teset head, it is possible to locate the test head near the probe card. Further, the length of the wiring between the test head and the probe card is reduced not to attenuate a test pulse signal, thereby achieving a higher precision analysis.

Still further, because the present invention employs a method in which an image is reflected from the rear side of the semiconductor wafer, the image obtained by light irradiating to the rear side of the semiconductor wafer is placed over an image (OBIC image or luminous image) obtained from current or light detected irom the semiconductor wafer by test analysis. Consequently, it is possible to display a defective portion more clearly.

In the respective embodiments, it becomes possible to analyze a failure or a defect on a product which is determined to be defective during semiconductor device manufacturing processing or particularly a functional test after wafer process ends, in the semiconductor wafer state. Thus, it is possible to improve fabrication yield and quality oi the semiconductor quickly, and to reduce the wafer process development period for particularly sophisticated semiconductor devices.

What is claimed is:

1. A semiconductor wafer test analysis apparatus for testing a semiconductor wafer including a plurality of circuits, metallic wiring, and electrode pads, said semiconductor wafer test analysis apparatus comprising:

light irradiating and detecting means for irradiating a rear surface of the semiconductor wafer with light, for detecting the light reflected from the rear surface, and for irradiating the rear surface with a laser beam for optical beam induced current analysis; and test pulse signal supplying and current detecting means for supplying a test pulse signal for test analysis of the semiconductor wafer, for connection to respective electrode pads on a front surface of the semiconductor wafer, and for detecting current generated in the semiconductor wafer in response to the light, said test pulse signal supplying and current detecting means including a probe card movable along X, Y, and Z axes and including a plurality of metallic needles for connecting the test pulse signal to respective electrode pads on the front surface of the semiconductor wafer and for receiving current generated in the semiconductor wafer, a positioning optical microscope for positioning each respective metallic needle of said probe card and a corresponding electrode pad ofthesemiconductor wafer, and a ring-like test head having a central through hole for receiving said positioning optical microscope, said test head generating and supplying the test pulse signal to said probe card and receiving current generated in the semiconductor wafer from said probe card, whereby said semiconductor wafer test analysis apparatus irradiates the semiconductor wafer from the rear surface with the semiconductor wafer actuated and detects a current generated in the semiconductor wafer to analyze a defective portion of the semiconductor wafer.

2. The semiconductor wafer test analysis apparatus according to claim 1 including display means for superposing a reflected light image formed from the light reflected from the rear surface of the semiconductor wafer, the reflected light image being obtained from said light irradiating and detecting means, over a current image obtained from current detected by said test pulse signal supplying and current detecting means.

3. A semiconductor wafer test analysis apparatus for testing a semiconductor wafer including a plurality of circuits, metallic wiring, and electrode pads on a front surface of thr semiconductor wafer, said semiconductor wafer test analysis apparatus comprising:

pulse signal supplying means for supplying a test pulse signal for test analysis of a semiconductor wafer while the semiconductor wafer is actuated and for supplying a pulse signal for luminous analysis to respective electrode pads on a front surface of the semiconductor wafer, said test pulse signal supplying means including:

a probe card movable along X, Y, and Z axes and including a plurality of metallic needles for connecting the test pulse signal and the luminous analysis pulse signal to respective electrode pads on the front surface of the semiconductor wafer and for receiving current generated in the semiconductor wafer, a positioning optical microscope for positioning each respective metallic needleof said probe card and a corresponding electrode pad of the semiconductor wafer, and a ring-like test head having a central through hole for receiving said positioning optical microscope, said test head generating and supplying the test pulse signal and the luminous analysis pulse signal tosaid probe card; and light irradiating and detecting means for irradiating a rear surface of the semiconductor wafer with light, for detecting light reflected from the rear surface and light generated in the semiconductor wafer in response to the test pulse signal and the pulse signal for luminous analysis at the rear surface of the semiconductor wafer for inspecting and analyzing a defective portion of the semiconductor wafer.

4. The semiconductor wafer test analysis apparatus according to claim 3 including display means for superposing a reflected light image formed from the light reflected from the rear surface of the semiconductor wafer, the reflected light image being obtained from said light irradiating and detecting means, over a luminous image obtained from light detected by said light irradiating and detecting means and generated in the semiconductor wafer in response to the luminous analysis pulse signal.

5. A semiconductor wafer test analysis apparatus for testing a semiconductor wafer including a plurality of circuits, metallic wiring, and electrode pads on a front surface of the semiconductor wafer, said semiconductor wafer test analysis apparatus comprising:

pulse signal supplying and current detecting means located at a front surface of a semiconductor wafer, said pulse signal supplying and current detectting means including a probe card movable along X, Y, and Z axes and including a plurality of metallic needles for connecting a test pulse signal and a luminous analysis pulse signal to electrode pads on the front surface of the semiconductor wafer and for receiving current generated in semiconductor wafer, a positioning optical microscope for positioning each respective metallic needle of said probe card and a corresponding electrode pad of the semiconductor wafer, and a ring-like test head having a central through hole for receiving said positioning optical microscope, said test head generating and supplying the test pulse signal and the pulse signal for luminous to said probe card and receiving current generated in the semiconductor wafer from said probe card; and light irradiating and detecting means located at a rear surface of the semiconductor wafer, said pulse signal supplying and current detecting means supplying the test signal and the luminous analysis pulse signal for test analysis to respective electrode pads on the front surface of the semiconductor wafer while the semiconductor wafer is actuated and detecting a current generated in the semiconductor wafer in response to light irradiation by said light irradiating and detecting means, said light irradiating and detecting means irradiating the rear surface of the semiconductor wafer with light, detecting light reflected from the rear surface of the semiconductor wafer, irradiating the rear surface with a laser beam for optical beam induced current analysis, and detecting light generated in the semiconductor wafer in response to the luminous analysis pulse signal.

6. The semiconductor wafer test analysis apparatus according to claim 5 including display means for superposing a reflected light image formed from the light reflected from the rear surface of the semiconductor wafer, the reflected light image being obtained from said light irradiating and detecting means, over either of a current image obtained from current detected by said pulse signal supplying and current detecting means or a luminous image obtained from light generated in the semiconductor wafer in response to the luminous analysis pulse signal.

7. A semiconductor wafer test analysis method for testing a semiconductor wafer in which a plurality of circuits, metallic wiring, and electrode pads are disposed on a front surface of the semiconductor wafer, said semiconductor wafer test analysis method comprising positioning a plurality of metallic needles on respective electrode pads on the front surface of the semiconductor wafer utilizing an optical microscope mounted in a through hole in a ring-like test head, supplying a test pulse signal for test analysis to respective electrode pads from the front of the semiconductor wafer, and with the semiconductor wafer actuated, detecting current generated in the semiconductor wafer at the electrode pads in response to the test pulse signal, detecting light at the front surface of the semiconductor wafer generated in response to the test pulse signal, and irradiating the rear surface of the semiconductor wafer with laser light and detecting current generated in the semiconductor wafer in response to the laser light.

\* \* \* \* \*

UNITED STATES PATENT AND TRADEMARK OFFICE
CERTIFICATE OF CORRECTION

PATENT NO. : 5,493,236      Page 1 of 2
DATED : February 20, 1996
INVENTOR(S) : Ishii et al.

It is certified that error appears in the above-indentified patent and that said Letters Patent is hereby corrected as shown below:

Column 11, Line 41, change "ofthesemiconductor" to --of the semiconductor--;

Line 64, change "thr" to --the--;

Column 12, Line 4, after "including" delete --:--;

Line 12, change "needleof" to --needle of--;

Line 18, change "tosaid" to --to said--;

UNITED STATES PATENT AND TRADEMARK OFFICE
CERTIFICATE OF CORRECTION

PATENT NO. : 5,493,236
DATED : February 20, 1996
INVENTOR(S) : Ishii et al.

It is certified that error appears in the above-indentified patent and that said Letters Patent is hereby corrected as shown below:

Line 44, change "detectting" to --detecting--;

Line 60, after "luminous" insert --analysis--;

Column 14, Line 11, after "front" insert --surface--.

Signed and Sealed this

Twenty-fifth Day of June, 1996

Attest:

BRUCE LEHMAN

Attesting Officer    Commissioner of Patents and Trademarks